(12) United States Patent
Kamiya et al.

(10) Patent No.: US 11,264,556 B2
(45) Date of Patent: Mar. 1, 2022

(54) PIEZOELECTRIC SENSOR

(71) Applicant: SEKISUI CHEMICAL CO., LTD., Osaka (JP)

(72) Inventors: Nobuto Kamiya, Osaka (JP); Tetsuhiro Kato, Osaka (JP); Yuuta Katsurayama, Osaka (JP); Kazuyoshi Iwane, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 505 days.

(21) Appl. No.: 16/330,424

(22) PCT Filed: Sep. 6, 2017

(86) PCT No.: PCT/JP2017/032173
§ 371 (c)(1),
(2) Date: Mar. 5, 2019

(87) PCT Pub. No.: WO2018/047878
PCT Pub. Date: Mar. 15, 2018

(65) Prior Publication Data
US 2021/0280770 A1   Sep. 9, 2021

(30) Foreign Application Priority Data

Sep. 6, 2016 (JP) ............................ JP2016-174038

(51) Int. Cl.
*H01L 41/113* (2006.01)
*G01L 1/16* (2006.01)
(Continued)

(52) U.S. Cl.
CPC ............ *H01L 41/1132* (2013.01); *G01L 1/16* (2013.01); *H01L 41/0471* (2013.01); *H01L 41/083* (2013.01); *H01L 41/193* (2013.01)

(58) Field of Classification Search
CPC ............. H01L 41/1132; H01L 41/0471; H01L 41/083; H01L 41/193; G01L 1/16
See application file for complete search history.

(56) References Cited

U.S. PATENT DOCUMENTS 4,624,796 A * 11/1986 Giniewicz ............. H01L 41/187
                                                                  252/62.9 R
2010/0230629 A1 * 9/2010 Yu ......................... H01L 41/193
                                                                  252/62.9 R
(Continued)

FOREIGN PATENT DOCUMENTS

CN    103531706     1/2014
JP    2009-192231   8/2009
(Continued)

OTHER PUBLICATIONS

"Conductive Silver Glue", https://www.itsfun.com.tw/%E5%B0%8E%E9%9B%BB%E9%8A%80%E8%86%A0/wiki-2806281-3327271, with Machine English Translation.
(Continued)

*Primary Examiner* — J. San Martin
(74) *Attorney, Agent, or Firm* — Wenderoth, Lind & Ponack, L.L.P.

(57) ABSTRACT

The present invention provides a piezoelectric sensor that has elastic properties in a surface direction thereof, and can smoothly follow stretching of a body to be measured to accurately measure movement of the body to be measured, and detect movement in a surface direction of a surface of the body to be measured on which the piezoelectric sensor is disposed. The piezoelectric sensor of the present invention includes: a piezoelectric sheet including a porous synthetic resin sheet; a signal electrode layer that is layered on a surface of the piezoelectric sheet and contains conductive fine particles and a binder resin having elastic properties; and a ground electrode layer that is layered on another
(Continued)

surface of the piezoelectric sheet and contains conductive fine particles and a binder resin having elastic properties.

6 Claims, 2 Drawing Sheets

(51) Int. Cl.
  *H01L 41/047* (2006.01)
  *H01L 41/083* (2006.01)
  *H01L 41/193* (2006.01)

(56) References Cited

U.S. PATENT DOCUMENTS

| | | |
|---|---|---|
| 2011/0318569 A1 | 12/2011 | Kobayashi et al. |
| 2013/0082763 A1 | 4/2013 | Inada et al. |
| 2016/0349124 A1* | 12/2016 | Chang ................... G06F 1/1694 |

FOREIGN PATENT DOCUMENTS

| | | |
|---|---|---|
| JP | 2012-225727 | 11/2012 |
| JP | 2014-199226 | 10/2014 |
| JP | 2015-184122 | 10/2015 |
| JP | 2016-33580 | 3/2016 |
| WO | 2010/101084 | 9/2010 |

OTHER PUBLICATIONS

"Young Modulus", https://zh.wikipedia.org/wiki/%E6%9D%A8%E6%B0%8F%E6%A8%A1%E9%87%8F, with Machine English Translation.

Extended European Search Report dated May 18, 2020 in corresponding European Patent Application No. 17848816.9.

International Search Report dated Dec. 5, 2017 in International (PCT) Application No. PCT/JP2017/032173.

* cited by examiner

PIEZOELECTRIC SENSOR

TECHNICAL FIELD

The present invention relates to a piezoelectric sensor.

BACKGROUND ART

A piezoelectric sheet is a permanently internally charged material obtained by injecting electric charges into an insulating polymer material.

As a piezoelectric sensor using the piezoelectric sheet, Patent Literature 1 discloses a piezoelectric sensor including: a piezoelectric sheet; a first ground electrode integrally layered on a first side of the piezoelectric sheet and having a first cutout section; a signal electrode integrally layered on a second side of the piezoelectric sheet and having a third cutout section; and a second ground electrode integrally layered on the signal electrode so as to be electrically insulated from the signal electrode and having a second cutout section. The cutout sections of the signal electrode, the first ground electrode, and the second ground electrode are at least partially overlapped with one another in a thickness direction of the piezoelectric sheet. In the piezoelectric sensor, a portion of the piezoelectric sheet exposed from a portion where the cutout sections of the signal electrode, the first ground electrode, and the second ground electrode are overlapped with one another in a thickness direction of the piezoelectric sheet serves as an exposed section.

CITATION LIST

Patent Literature

Patent Literature 1: WO2010/101084

SUMMARY OF INVENTION

Technical Problem

However, in a piezoelectric body constituting the piezoelectric sensor of Patent Literature 1, a film of a resin such as polyethylene terephthalate and polyethylene naphthalate is used as an insulating film on which the signal electrode and the ground electrodes are supported.

Therefore, the piezoelectric sensor of Patent Literature 1 does not have elastic properties in a surface direction and a property of following stretching. Accordingly, the piezoelectric sensor has a problem, for example, the piezoelectric sensor cannot be applied to wearable applications such as use by attachment to a skin surface of a body.

The present invention provides a piezoelectric sensor that has elastic properties in a surface direction thereof, and can smoothly follow stretching of a body to be measured to accurately measure movement of the body to be measured, and detect movement in a surface direction of a surface of the body to be measured on which the piezoelectric sensor is disposed.

Solution to Problem

The piezoelectric sensor of the present invention includes: a piezoelectric sheet including a porous synthetic resin sheet; a signal electrode layer that is layered on a surface of the piezoelectric sheet and contains conductive fine particles and a binder resin having elastic properties; and a ground electrode layer that is layered on another surface of the piezoelectric sheet and contains conductive fine particles and a binder resin having elastic properties.

Advantageous Effects of Invention

Due to the configuration as described above, the piezoelectric sensor of the present invention has elastic properties in a surface direction thereof. Even when a surface of an object of which the movement is to be detected (hereinafter referred to as "body to be measured") on which the piezoelectric sensor is disposed is stretched or contracted in a surface direction thereof, the piezoelectric sensor of the present invention can smoothly follow stretching or contraction of the body to be measured, maintain excellent adhesion to the body to be measured, and accurately measure movement of the body to be measured (property of following stretching and contraction).

Further, the piezoelectric sensor of the present invention can also detect movement in the surface direction of the surface of the body to be measured on which the piezoelectric sensor is disposed (detectability of stretching and contraction).

DESCRIPTION OF EMBODIMENTS

Figure 1:
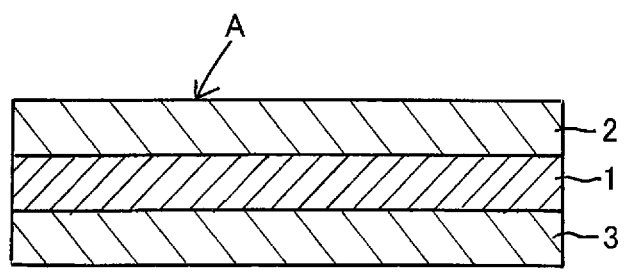
FIG. 1 is a cross-sectional view illustrating a piezoelectric sensor according to the present invention.

An example of a piezoelectric sensor according to the present invention will be described with reference to the drawings. As illustrated in FIG. 1, a piezoelectric sensor A includes a piezoelectric sheet 1 including a porous synthetic resin sheet. The synthetic resin constituting the porous synthetic resin sheet is not particularly limited, and examples thereof include a polyolefin-based resin such as a polyethylene-based resin and a polypropylene-based resin, a fluorine resin such as polyvinylidene fluoride, a polylactic acid, a liquid crystal resin, and a layered sheet of a nonwoven fabric containing polytetrafluoroethylene. The synthetic resin preferably includes a polyolefin-based resin, and more preferably includes a polypropylene-based resin.

The synthetic resin preferably has excellent insulation properties. As the synthetic resin, the synthetic resin preferably has a volume resistivity value (hereinafter simply referred to as "volume resistivity value"), after voltage application at an applied voltage of 500 V for 1 minute in accordance with JIS K 6911, of $1.0 \times 10^{10}$ Ω·m or more.

The volume resistivity value of the synthetic resin is preferably $1.0 \times 10^{12}$ Ω·m or more, more preferably $1.0 \times 10^{14}$ Ω·m or more because the piezoelectric sheet has more excellent piezoelectric properties.

Examples of the polyethylene-based resin include an ethylene homopolymer or a copolymer of ethylene and at least one α-olefin having 3 to 20 carbon atoms which contains more than 50% by mass of an ethylene component. Examples of the ethylene homopolymer include low density polyethylene (LDPE) obtained by radical polymerization under high pressure, medium- or low-pressure high density polyethylene (HDPE) obtained by polymerization in the presence of a catalyst at medium or low pressure. Linear low density polyethylene (LLDPE) can be obtained by copolymerizing ethylene and α-olefin. Examples of the α-olefin include propylene, 1-butene, 1-pentene, 1-hexene, 4-methyl-1-pentene, 1-octene, 1-nonene, 1-decene, 1-tetradecene, 1-hexadecene, 1-octadecene, and 1-eicosene, and an α-olefin having 4 to 10 carbon atoms is preferable. The content of the α-olefin in the linear low density polyethylene is usually 1 to 15% by mass.

The polypropylene-based resin is not particularly limited as long as it contains a propylene component in an amount of more than 50% by mass. Examples thereof include a propylene homopolymer (homopolypropylene), and a copolymer of propylene and at least one olefin having 20 or less carbon atoms other than propylene. The polypropylene-based resins may be used alone, or two or more of them may be used in combination. The copolymer of propylene and at least one olefin having 20 or less carbon atoms other than propylene may be either a block copolymer or a random copolymer.

Examples of the α-olefin to be copolymerized with propylene include ethylene, 1-butene, 1-pentene, 4-methyl-1-pentene, 1-hexene, 1-octene, 1-nonene, 1-decene, 1-tetradecene, 1-hexadecene, 1-octadecene, and 1-eicosene.

The foaming ratio of the porous synthetic resin sheet is preferably 1.5 to 15 times, more preferably 2 to 10 times, particularly preferably 2 to 8 times, and most preferably 3 to 7 times. A porous synthetic resin sheet having a foaming ratio of 1.5 times or more has excellent elastic properties in the surface direction of the piezoelectric sheet and improved property of following stretching and contraction and detectability of stretching and contraction. Therefore, such a porous synthetic resin sheet is preferable. A porous synthetic resin sheet having a foaming ratio of 15 times or less allows mechanical strength of the piezoelectric sensor to be enhanced or causes the air bubble diameter to decrease to stabilize the piezoelectric properties of the piezoelectric sheet, and has improved property of following stretching and contraction and detectability of stretching and contraction. Therefore, such a porous synthetic resin sheet is preferable. The foaming ratio of the porous synthetic resin sheet is a value obtained by dividing the density of the whole synthetic resin constituting the porous synthetic resin sheet by the density of the porous synthetic resin sheet.

The porosity of the porous synthetic resin sheet is preferably 30% or more, more preferably 45% or more, and particularly preferably 60% or more. The porosity of the porous synthetic resin sheet is preferably 95% or less, more preferably 93% or less, and particularly preferably 90% or less. A porous synthetic resin sheet having a porosity of 30% or more has excellent elastic properties in the surface direction of the piezoelectric sheet and improved property of following stretching and contraction and detectability of stretching and contraction. Therefore, such a porous synthetic resin sheet is preferable. A porous synthetic resin sheet having a porosity of 95% or less allows mechanical strength of the piezoelectric sensor to be enhanced or causes the air bubble diameter to decrease to stabilize the piezoelectric properties of the piezoelectric sheet, and has improved property of following stretching and contraction and detectability of stretching and contraction. Therefore, such a porous synthetic resin sheet is preferable. The porosity of the porous synthetic resin sheet is a value obtained by dividing the total volume of pores in the porous synthetic resin sheet by the apparent volume of the porous synthetic resin sheet and multiplying the calculated value by 100.

The thickness of the porous synthetic resin sheet is preferably 10 to 300 μm, and more preferably 30 to 200 μm. A porous synthetic resin sheet having a thickness of 10 μm or more allows mechanical strength of the piezoelectric sheet to be enhanced. A porous synthetic resin sheet having a thickness of 300 μm or less allows the piezoelectric properties of the piezoelectric sheet to be stabilized. Therefore, such a porous synthetic resin sheet is preferable.

The ratio of stretching and contraction of the piezoelectric sheet 1 is preferably 0.5% or more, more preferably 1% or more, particularly preferably 1.5% or more, and most particularly preferably 1.8% or more. The ratio of stretching and contraction of the piezoelectric sheet is preferably 30% or less, more preferably 20% or less, particularly preferably 10% or less, and most particularly preferably 7% or less. A piezoelectric sheet 1 having a ratio of stretching and contraction of 0.5% or more has improved property of following stretching and contraction and detectability of stretching and contraction. Therefore, such a piezoelectric sheet 1 is preferable. A piezoelectric sheet 1 having a ratio of stretching and contraction of 30% or less allows the piezoelectric sheet to maintain stable piezoelectric properties for an elongated period of time and has improved property of following stretching and contraction and detectability of stretching and contraction. Therefore, such a piezoelectric sheet 1 is preferable. The ratio of stretching and contraction (%) of the piezoelectric sheet is a value measured by the following procedure. The piezoelectric sheet is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the piezoelectric sheet is a value calculated by the following expression.

Ratio of stretching and contraction (%)=100×[length (cm) of specimen in stretching direction during stretching−5]/5

The ratio of change in electric resistivity of the piezoelectric sheet 1 during stretching by 5% is preferably 10% or less, more preferably 8% or less, and particularly preferably 6% or less. A piezoelectric sensor in which the ratio of change in electric resistivity during stretching by 5% is 10% or less maintains excellent piezoelectric properties even when the piezoelectric sensor is stretched in the surface direction. The ratio of change in electric resistivity of the piezoelectric sheet during stretching by 5% is a ratio of change between two points, that is, between the initial electric resistivity and the electric resistivity during stretching by 5%, and is a value obtained by dividing the electric resistivity ($\Omega$) during stretching by 5% by the initial electric resistivity ($\Omega$). The ratio of change in electric resistivity of the piezoelectric sheet during stretching by 5% can be measured by a measurement device, which is, for example, commercially available from HIOKI E.E. CORPORATION as trade name "LCR meter."

The piezoelectric sheet 1 is constituted by charging the porous synthetic resin sheet. A method for charging the porous synthetic resin sheet is not particularly limited. Examples thereof include a method for applying direct-current electrolysis to the porous synthetic resin sheet.

The method for applying direct electric field to the porous synthetic resin sheet is not particularly limited. Examples thereof include (1) a method in which the porous synthetic resin sheet is interposed between a pair of plate electrodes, the plate electrode in contact with a surface to be charged is connected to a high-voltage direct-current power supply, the other plate electrode is grounded, and a direct-current or pulsed high voltage is applied to the porous synthetic resin sheet to inject electric charges into the synthetic resin, resulting in charging the porous synthetic resin sheet; and (2) a method in which a grounded plate electrode is overlapped in close contact with a first surface of the porous synthetic resin sheet, a needle electrode or wire electrode electrically connected to a direct-current high-voltage power supply is arranged on a second surface side of the porous synthetic resin sheet with a predetermined gap therebetween, corona discharge is generated by a concentrated electric field near the tip of the needle electrode or the surface of the wire electrode to ionize air molecules, and the porous synthetic resin sheet is charged by repulsion of the air ions generated by the polarity of the needle electrode or the wire electrode.

The absolute value of voltage during a direct-current treatment in which a direct electric field is applied to the porous synthetic resin sheet is preferably 5 to 40 kV, and more preferably 10 to 30 kV. A piezoelectric sheet obtained by adjusting the voltage during the direct-current treatment within the aforementioned range maintains excellent piezoelectric properties even during stretching.

The piezoelectric sensor A is configured by integrally layering a signal electrode layer 2 on a surface (first surface) of the piezoelectric sheet 1 and integrally layering a ground electrode layer 3 on another surface (second surface) of the piezoelectric sheet 1. The potential generated in the piezoelectric sheet of the piezoelectric sensor can be measured by measuring the potential of the signal electrode by using the ground electrode as a reference electrode. The surface (first surface) of the piezoelectric sheet 1 is a surface having the largest area of the piezoelectric sheet 1. The other surface (second surface) of the piezoelectric sheet 1 is a surface on a side opposite to the surface (first surface) of the piezoelectric sheet 1.

Specifically, the signal electrode layer 2 containing conductive fine particles and a binder resin having elastic properties is layered on the surface of the piezoelectric sheet 1. The signal electrode layer 2 is configured by dispersing the conductive fine particles in the binder resin having elastic properties. Therefore, the signal electrode layer 2 expresses excellent elastic properties, and thus, can smoothly follow the movement in a surface direction of the surface of the body to be measured on which the piezoelectric sensor is disposed. Hence, the piezoelectric sensor can detect the movement of the surface of the body to be measured with accuracy (property of following stretching and contraction), and can also detect the movement in the surface direction of the surface of the body to be measured on which the piezoelectric sensor is disposed with accuracy (detectability of stretching and contraction). A signal electrode layer 2 or a plurality of patterned signal electrode layers 2 may be layered on the surface of the piezoelectric sheet 1.

Similarly, the ground electrode layer 3 containing conductive fine particles and a binder resin having elastic properties is layered on the other surface of the piezoelectric sheet 1. The ground electrode layer 3 is configured so that the conductive fine particles are dispersed in the binder resin having elastic properties. Therefore, the ground electrode layer 3 expresses excellent elastic properties, and thus, the movement in a surface direction of the surface of the body to be measured on which the piezoelectric sensor is disposed can be smoothly followed. Hence, the piezoelectric sensor can detect the movement of the surface of the body to be measured with accuracy (property of following stretching and contraction), and can detect the movement in the surface direction of the surface of the body to be measured on which the piezoelectric sensor is disposed with accuracy (detectability of stretching and contraction). A ground electrode layer 2 or a plurality of patterned ground electrode layers 2 may be layered on the surface of the piezoelectric sheet 1.

The conductive fine particles constituting the signal electrode layer 2 and the ground electrode layer 3 are not particularly limited as long as they can impart conductivity to the signal electrode layer 2 and the ground electrode layer 3. Examples thereof include metal fine particles such as silver fine particles, aluminum fine particles, copper fine particles, nickel fine particles and palladium fine particles, carbon-based conductive fine particles such as carbon black, graphite, carbon nanotubes, carbon fibers, and metal coated carbon black, ceramic-based conductive fine particles such as tungsten carbide, titanium nitride, zirconium nitride, and titanium carbide, and conductive potassium titanate whiskers. Metal fine particles are preferable, and silver fine particles are more preferable. The conductive fine particles may be used alone, or two or more of them may be used in combination. Note that the conductive fine particles contained in the signal electrode layer 2 and the conductive fine particles contained in the ground electrode layer 3 may be the same as or different from each other.

The average particle diameter of the conductive fine particles contained in the signal electrode layer 2 is preferably 0.01 to 50 μm, more preferably 0.1 to 30 μm, and particularly preferably 0.5 to 25 μm. The average particle diameter of the conductive fine particles contained in the ground electrode layer 3 is preferably 0.01 to 50 μm, more preferably 0.1 to 30 μm, and particularly preferably 0.5 to 25 μm. Conductive fine particles having an average particle diameter falling within the aforementioned range can impart conductivity to the signal electrode layer 2 and the ground electrode layer 3 while maintaining the elastic properties of the signal electrode layer 2 and the ground electrode layer 3.

The average particle diameter of the conductive fine particles can be measured by the following procedure. The signal electrode layer 2 and the ground electrode layer 3 are cut in a thickness direction thereof, and an optional portion of the cut surface is photographed by an electron microscope to obtain an enlarged photograph at a magnification of 1,000. Among the conductive fine particles appearing in the enlarged photograph, the diameters of 100 optional conductive fine particles are measured. The diameter of the conductive fine particles means the diameter of perfect circle having the smallest particle diameter that may surround the conductive fine particles appearing in the enlarged photograph. The arithmetic average value of diameters of the conductive fine particles is adopted as the average particle diameter of the conductive fine particles.

The content of the conductive fine particles contained in the signal electrode layer 2 is preferably 40 to 90 parts by mass, more preferably 60 to 85 parts by mass, and particularly preferably 60 to 80 parts by mass, relative to 100 parts by mass of the binder resin. The content of the conductive fine particles contained in the ground electrode layer 3 is preferably 40 to 90 parts by mass, more preferably 60 to 85 parts by mass, and particularly preferably 60 to 80 parts by mass, relative to 100 parts by mass of the binder resin. Conductive fine particles that are contained in the signal electrode layer 2 and the ground electrode layer 3 in respective amounts falling within the above ranges can impart conductivity to the signal electrode layer 2 and the ground electrode layer 3 while maintaining the elastic properties of the signal electrode layer 2 and the ground electrode layer 3.

The binder resin constituting the signal electrode layer 2 and the ground electrode layer 3 may be any resin as long as it can follow stretching or contraction in the surface direction of the piezoelectric sheet and can impart, to the signal electrode layer 2 and the ground electrode layer 3, elastic properties capable of stretching and contraction without causing damage such as cracks.

Examples of the binder resin include a modified silicone, an acrylic-modified polymer, a thermoplastic elastomer such as a styrene-based thermoplastic elastomer, a polyolefin-based thermoplastic elastomer, a polyvinyl chloride-based thermoplastic elastomer, a polyurethane-based thermoplastic elastomer, a polyester-based thermoplastic elastomer, a polyamide-based thermoplastic elastomer, a polyamide-based thermoplastic elastomer, and 1,2-polybutadiene-based thermoplastic elastomer, and a rubber material such as a polychloroprene (CR), an EPDM, a polyisoprene rubber (IR), a polybutadiene rubber (BR), a styrene-butadiene copolymer rubber (SBR), an acrylonitrile-butadiene copolymer rubber (NBR), an ethylene-propylene copolymer rubber, and a butyl rubber. The binder resin may be used alone, or two or more kinds thereof may be used in combination.

There is no particular limitation on the method for integrally layering the signal electrode layer 2 and the ground electrode layer 3 on the surfaces of the piezoelectric sheet 1. Example thereof include (1) a method in which a conductive coating material obtained by dispersing or dissolving conductive fine particles and a binder resin in a solvent is applied to the surface of a piezoelectric sheet and then the solvent in the conductive coating material is removed, so that the signal electrode layer 2 or the ground electrode layer 3 is integrally layered on the surface of the piezoelectric sheet 1; and (2) a method in which a conductive coating material obtained by dispersing conductive fine particles in a curable resin is applied to the surface of a piezoelectric sheet and then the curable resin is cured by heating or ionizing radiation to form a binder resin, so that the signal electrode layer 2 or the ground electrode layer 3 is integrally layered on the surface of the piezoelectric sheet 1. Examples of the ionizing radiation include an electron beam, an ultraviolet ray, an alpha ray, a beta ray, and a gamma ray.

The ratio of stretching and contraction of the signal electrode layer 2 is preferably 0.5%, more preferably 3% or more, particularly preferably 5% or more, and most preferably 7% or more. The ratio of stretching and contraction of the signal electrode layer 2 is preferably 23% or less, more preferably 15% or less, particularly preferably 13% or less, and most preferably 11% or less. A signal electrode layer 2 having a ratio of stretching and contraction of 0.5% or more has improved property of following stretching and contraction and detectability of stretching and contraction. Therefore, such a signal electrode layer 2 is preferable. A signal electrode layer 2 having a ratio of stretching and contraction of 23% or less allows accuracy of piezoelectric properties of the piezoelectric sensor to be improved and has improved property of following stretching and contraction and detectability of stretching and contraction. Therefore, such a signal electrode layer 2 is preferable. The ratio of stretching and contraction (%) of the signal electrode layer 2 is a value measured by the following procedure. The signal electrode layer 2 is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the signal electrode layer 2 is a value calculated by the following expression. For example, the ratio of stretching and contraction of the signal electrode layer 2 can be measured by TENSILON a commercially available from ORIENTEC Co., LTD.

Ratio of stretching and contraction (%)=100×[length (cm) of specimen in stretching direction during stretching−5]/5

The ratio of stretching and contraction of the ground electrode layer 3 is preferably 0.5%, more preferably 3% or more, particularly preferably 5% or more, and most preferably 7% or more. The ratio of stretching and contraction of the ground electrode layer 3 is preferably 23% or less, more preferably 15% or less, particularly preferably 13% or less, and most preferably 11% or less. A ground electrode layer 3 having a ratio of stretching and contraction of 0.5% or more has improved property of following stretching and contraction and detectability of stretching and contraction. Therefore, such a ground electrode layer 3 is preferable. A ground electrode layer 3 having a ratio of stretching and contraction of 23% or less allows accuracy of piezoelectric properties of the piezoelectric sensor to be improved and has improved property of following stretching and contraction and detectability of stretching and contraction. Therefore, such a ground electrode layer 3 is preferable. The ratio of stretching and contraction (%) of the ground electrode layer 3 is a value measured by the following procedure. The ground electrode layer 3 is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the ground electrode layer 3 is a value calculated by the following expression. For example, the ratio of stretching and contraction of the ground electrode layer 3 can be measured by TENSILON commercially available from ORIENTEC Co., LTD.

Ratio of stretching and contraction (%)=100×[length (cm) of specimen in stretching direction during stretching−5]/5

Figure 2:
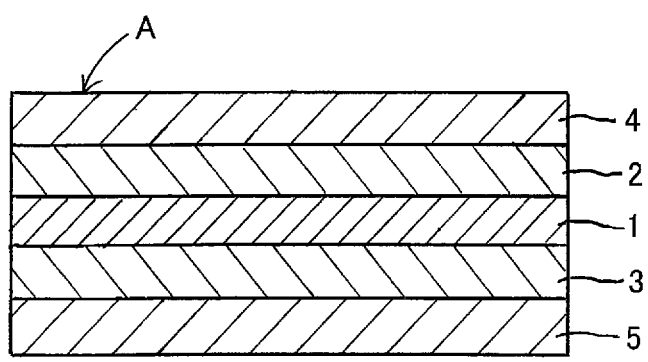
FIG. 2 is a cross-sectional view illustrating another example of the piezoelectric sensor according to the present invention.
Figure 3:
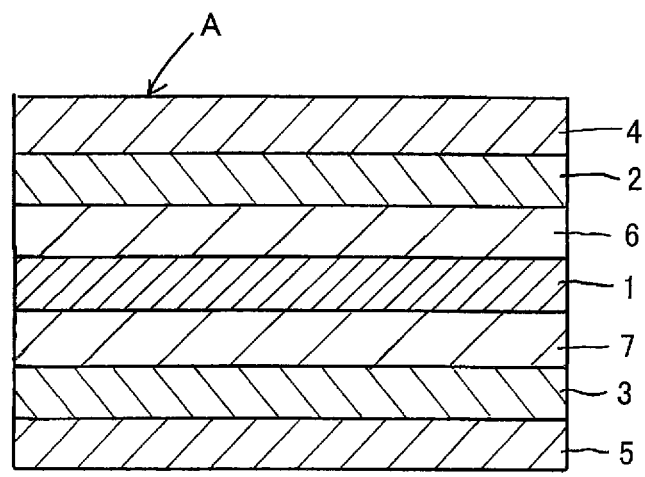
FIG. 3 is a cross-sectional view illustrating another example of the piezoelectric sensor according to the present invention.

A case where the signal electrode layer 2 and the ground electrode layer 3 are integrally layered directly on the surfaces of the piezoelectric sheet 1 is described above. However, as shown in FIGS. 2 and 3, the piezoelectric sensor A may be configured by supporting (integrally layering) the signal electrode layer 2 and the ground electrode layer 3 on surfaces of elastic synthetic resin sheets 4 and 5, respectively, and integrally layering the elastic synthetic resin sheets 4 and 5 on the surfaces of the piezoelectric sheet 1 via a fixing agent, if necessary, so that surfaces thereof to form the signal electrode layer 2 and the ground electrode layer 3 face the piezoelectric sheet 1.

The elastic synthetic resin sheets 4 and 5 are not particularly limited as long as they can follow stretching or contraction in the surface direction of the piezoelectric sheet 1 and are capable of stretching and contraction without causing damage such as cracks. Examples of the synthetic resin constituting the elastic synthetic resin sheets 4 and 5 include a thermoplastic elastomer such as a styrene-based thermoplastic elastomer, a polyolefin-based thermoplastic elastomer, a polyvinyl chloride-based thermoplastic elastomer, a polyurethane-based thermoplastic elastomer, a polyester-based thermoplastic elastomer, a polyamide-based thermoplastic elastomer, a polyamide-based thermoplastic elastomer, and 1,2-polybutadiene-based thermoplastic elastomer, and a rubber material such as a polychloroprene (CR), an EPDM, a polyisoprene rubber (IR), a polybutadiene rubber (BR), a styrene-butadiene copolymer rubber (SBR), an acrylonitrile-butadiene copolymer rubber (NBR), an ethylene-propylene copolymer rubber, and a butyl rubber. The binder resin may be used alone, or two or more kinds thereof may be used in combination.

The ratio of stretching and contraction of the elastic synthetic resin sheets 4 and 5 is preferably 0.5% or more, more preferably 3% or more, particularly preferably 5% or more, and most preferably 7% or more. The ratio of stretching and contraction of the elastic synthetic resin sheets 4 and 5 is preferably 28% or less, more preferably 20% or less, particularly preferably 18% or less, and most preferably 16% or less. Elastic synthetic resin sheets 4 and 5 having a ratio of stretching and contraction of 0.5% or more have improved property of following stretching and contraction and detectability of stretching and contraction. Therefore, such elastic synthetic resin sheets 4 and 5 are preferable. Elastic synthetic resin sheets 4 and 5 having a ratio of stretching and contraction of 28% or less allow accuracy of piezoelectric properties of the piezoelectric sensor to be improved. Therefore, such elastic synthetic resin sheets 4 and 5 are preferable. The ratio of stretching and contraction (%) of the elastic synthetic resin sheets 4 and 5 is a value measured by the following procedure. The elastic synthetic resin sheet 4, 5 is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the elastic synthetic resin sheets 4 and 5 is a value calculated by the following expression. For example, the ratio of stretching and contraction of the elastic synthetic resin sheets 4 and 5 can be measured by TENSILON commercially available from ORIENTEC Co., LTD.

$$\text{Ratio of stretching and contraction (\%)}=100\times[\text{length (cm) of specimen in stretching direction during stretching}-5]/5$$

A method for supporting the signal electrode layer 2 or the ground electrode layer 3 on the surface of the elastic synthetic resin sheet 4 or 5 is not particularly limited. Examples thereof include (1) a method in which a conductive coating material obtained by dispersing or dissolving conductive fine particles and a binder resin in a solvent is applied to the surface of an elastic synthetic resin sheet, and then the solvent in the conductive coating material is removed, so that the signal electrode layer 2 or the ground electrode layer 3 is integrally layered on the surface of the elastic synthetic resin sheet 4 or 5; and (2) a method in which a conductive coating material obtained by dispersing conductive fine particles in a curable resin is applied to the surface of the elastic synthetic resin sheet 4 or 5 and then the curable resin is cured by heating or ionizing radiation to form a binder resin, so that the signal electrode layer 2 or the ground electrode layer 3 is integrally layered on the surface of the elastic synthetic resin sheet 4 or 5.

The piezoelectric sheet and the elastic synthetic resin sheet can be subjected to a publicly known surface treatment to improve the adhesion force of the conductive coating material. Examples of the surface treatment method include a corona treatment, a primer treatment, and a sand blasting treatment.

A method for integrally layering the elastic synthetic resin sheets 4 and 5 supporting the signal electrode layer 2 and the ground electrode layer 3, respectively, on the surfaces of the piezoelectric sheet 1 is not particularly limited. Examples thereof include (1) a method for integrally layering the elastic synthetic resin sheets 4 and 5 supporting the signal electrode layer 2 and the ground electrode layer 3, respectively, on the surfaces of the piezoelectric sheet 1 by using tackiness of the signal electrode layer 2 or the ground electrode layer 3 when the signal electrode layer 2 or the ground electrode layer 3 has tackiness or adhesiveness (see FIG. 2); and (2) a method for integrally layering the elastic synthetic resin sheets 4 and 5 supporting the signal electrode layer 2 and the ground electrode layer 3, respectively, on the surfaces of the piezoelectric sheet 1 via fixing agents 6 and 7 having elastic properties (see FIG. 3). The fixing agents 6 and 7 include a reaction-based, solvent-based, aqueous, or hot melt-based adhesive or tackiness agent. From the viewpoint of maintaining the sensitivity of the piezoelectric sheet 1, a fixing agent having low dielectric constant is preferable. Examples of the fixing agents 6 and 7 include a tackiness agent such as an acrylic tackiness agent, and a double-sided adhesive tape.

In a state where the elastic synthetic resin sheet 4 or 5 supporting the signal electrode layer 2 or the ground electrode layer 3 is integrally layered on the surface of the piezoelectric sheet 1 via the fixing agent, the ratio of stretching and contraction of the fixing agent is preferably 0.5% or more, more preferably 3% or more, particularly preferably 5% or more, and most preferably 7% or more. The ratio of stretching and contraction of the fixing agent is preferably 70% or less, more preferably 65% or less, and particularly preferably 60% or less. A fixing agent having a ratio of stretching and contraction of 0.5% or more has improved property of following stretching and contraction and detectability of stretching and contraction. Therefore, such a fixing agent is preferable. A fixing agent having elastic properties can effectively prevent separation of the elastic synthetic resin sheet 4 or 5 and the piezoelectric sheet 1. A fixing agent having a ratio of stretching and contraction of 70% or less causes the piezoelectric sensor to maintain excellent piezoelectric properties with time. Therefore, such a fixing agent is preferable. The ratio of stretching and contraction (%) of the fixing agent is a value measured by the following procedure. The fixing agent is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the fixing agent is a value calculated by the following expression. For example, the ratio of stretching and contraction of the fixing agent can be measured by TENSILON commercially available from ORIENTEC Co., LTD.

$$\text{Ratio of stretching and contraction (\%)}=100\times[\text{length (cm) of specimen in stretching direction during stretching}-5]/5$$

When the piezoelectric sensor A configured as described above has the constituent elements including the piezoelectric sheet 1, the signal electrode layer 2, the ground electrode layer 3, the elastic synthetic resin sheets 4 and 5, and the fixing agents 6 and 7, the elastic synthetic resin sheets 4 and 5 and the fixing agents 6 and 7 are freely stretchable in the surface direction of the piezoelectric sheet 1. Therefore, the piezoelectric sensor A bonded in close contact with the body to be measured can be stretched or contracted so as to smoothly follow the movement in the surface direction of the surface of the body to be measured on which the piezoelectric sensor is disposed, and be favorably held in close contact with the surface of the body to be measured, and detect the movement of the body to be measured with accuracy. Thus, the piezoelectric sensor A can smoothly follow the movement in the surface direction of the surface (disposition surface of piezoelectric sensor) of the object of which the movement is detected ("body to be measured") on which the piezoelectric sensor is disposed. Accordingly, the piezoelectric sensor A can smoothly follow fine movement of the skin of human body, and the like. The piezoelectric sensor A can be suitably used for applications such as use by bonding to the skin of human body or attachment to the human body, that is, wearable applications. The piezoelectric sensor A can detect vital signals such as signals of pulse wave and respiration with accuracy. Examples of the body to be measured include a human body, a concrete structure, a bridge, and transportation equipment such as a vehicle.

The piezoelectric sensor A can be stretched or contracted so as to smoothly follow the movement in the surface direction of the surface of the body to be measured on which the piezoelectric sensor is disposed. However, the thickness of the piezoelectric sheet 1 in the thickness direction thereof is changed during stretching and contraction, and an electric charge is expressed due to the change in thickness. By detecting the electric charge, the piezoelectric sensor A can detect the movement in the surface direction of the surface of the body to be measured on which the piezoelectric sensor is disposed with accuracy.

For example, exposure to sunlight or wind and rain degrades a wall surface of a concrete structure such as a building with time, to cause a crack such as a fissure. Due to the crack, the wall surface of the concrete structure is moved in the surface direction thereof. When the piezoelectric sensor A is bonded in close contact with the wall surface of the concrete structure, the piezoelectric sensor A can detect the movement of the wall surface due to the crack with accuracy. Therefore, a damage such as the crack caused in the concrete structure can be rapidly recognized, and a countermeasure can be smoothly taken.

The ratio of stretching and contraction of the whole piezoelectric sensor A is preferably 0.5% or more, more preferably 0.7% or more, furthermore preferably 0.8% or more, and particularly preferably 0.9% or more. The ratio of stretching and contraction of the whole piezoelectric sensor A is preferably 15% or less, more preferably 13% or less, particularly preferably 11% or less, and most preferably 4% or less. A piezoelectric sensor A having a ratio of stretching and contraction of 0.5% or more as a whole has improved property of following stretching and contraction and detectability of stretching and contraction. Therefore, such a piezoelectric sensor A is preferable. A piezoelectric sensor A having a ratio of stretching and contraction of 15% or less as a whole maintains excellent piezoelectric properties with time. Therefore, such a piezoelectric sensor A is preferable. The ratio of stretching and contraction (%) of the whole piezoelectric sensor A is a value measured by the following procedure. The piezoelectric sensor A is cut out to obtain a specimen having a flat square shape with a side of 5 cm. This specimen is stretched in a direction of optional side thereof by a force of 10 N. During stretching, the length (cm) of the specimen in a stretching direction is measured. The ratio of stretching and contraction (%) of the piezoelectric sensor A is a value calculated by the following expression. For example, the ratio of stretching and contraction of the piezoelectric sensor A can be measured by TENSILON commercially available from ORIENTEC Co., LTD.

Ratio of stretching and contraction (%)=100×[length (cm) of specimen in stretching direction during stretching−5]/5

EXAMPLES

Hereinafter, Examples of the present invention will be described, but the present invention is not limited to the following Examples.

Examples 1 to 5

100 parts by mass of a propylene-ethylene random copolymer (trade name "NOVATEC EG8B" manufactured by Japan Polypropylene Corporation, content of ethylene unit: 5% by mass), 3.3 parts by mass of trimethylolpropane trimethacrylate, azodicarbonamide, and 2 parts by mass of a phenol-based antioxidant were supplied to an extruder, melted and kneaded, and extruded from a T-die in a sheet shape. As a result, a foamable resin sheet having a thickness of 180 μm was produced. The foamable resin sheet was cut into a flat square shape with a side of 30 cm. The amount of azodicarbonamide supplied to the extruder is shown in Table 1.

Both surfaces of the foamable resin sheet thus obtained were irradiated with an electron beam under conditions of an accelerating voltage of 300 kV and an intensity of 25 kGy, to crosslink the propylene-ethylene random copolymer of the foamable resin sheet. The foamable resin sheet was foamed by heating to 250° C., to obtain a foamed sheet. The obtained foamed sheet was heated so that the surface temperature thereof was 140° C., and then uniaxially stretched. The foaming ratio, thickness, and porosity of the foamed sheet are shown in Table 1.

A grounded plate electrode was overlapped in close contact with a first surface of the foamed sheet, a needle-shaped electrode electrically connected to a direct-current high-voltage power supply was disposed on a second surface side of the foamed sheet with a predetermined gap therebetween, and corona discharge was caused by a concentrated electric field near the surface of the needle-shaped electrode under conditions of a voltage of −20 kV, a discharge distance of 10 mm, and a voltage-applying time of 1 minute, to ionized air molecules. Air ions generated by the polarity of the needle-shaped electrode were repulsed, and a direct electric field was applied to the foamed sheet, to inject an electric charge. Accordingly, the whole of the foamed sheet was charged. The foamed sheet in which an electrical charge was injected was held for 3 hours while the foamed sheet was wrapped with a grounded aluminum foil. As a result, a piezoelectric sheet was obtained. The piezoelectric constant d33 of the piezoelectric sheet is shown in Table 1.

As elastic synthetic resin sheets, two polyurethane-based thermoplastic elastomer sheets having elastic properties and a thickness of 50 μm (trade name "Tough Grace Film" manufactured by Takeda Sangyo Corporation) and two polyurethane-based thermoplastic elastomer sheets having elastic properties and a thickness of 25 μm (trade name "Tough Grace Film" manufactured by Takeda Sangyo Corporation) were prepared. A polyurethane-based thermoplastic elastomer sheet having a thickness shown in Table 1 was selected. A conductive coating material containing silver fine particles (average particle diameter: 2 μm) and an acrylic modified polymer as a curable resin (trade name "SX-ECA48" manufactured by CEMEDINE CO., LTD.) were prepared. The conductive coating material was applied to a surface of each of two polyurethane-based thermoplastic elastomer sheets, and heated at 100° C. for 3 hours, to cure the curable resin, so that a binder resin was formed. An electrode layer in which the silver fine particles were uniformly dispersed in the binder resin was integrally layered on the surface of the polyurethane-based thermoplastic elastomer sheet. The thickness of the electrode layer is shown in Table 1. The binder resin had elastic properties. The electrode layer contained the silver fine particles in an amount of 65 parts by mass relative to 100 parts by mass of the binder resin.

As a fixing agent, a double-sided adhesive tape (trade name "WT#5402" manufactured by Sekisui Chemical Co., Ltd., thickness: 25 μm) was prepared. The double-sided adhesive tape was bonded as the fixing agent to both faces of the piezoelectric sheet. The polyurethane-based thermoplastic elastomer sheet was integrally layered on each of the both faces of the piezoelectric sheet via the fixing agent so that the electrode layer was on a piezoelectric sheet side, to obtain the piezoelectric sheet. The fixing agent had elastic properties. The electrode layer supported on a surface of the polyurethane-based thermoplastic elastomer sheet integrally layered on a surface of the piezoelectric sheet 1 was served as a signal electrode layer. The electrode layer supported on a surface of the polyurethane-based thermoplastic elastomer sheet integrally layered on another surface of the piezoelectric sheet 1 was served as a ground electrode layer. The polyurethane-based thermoplastic elastomer sheet, the signal electrode layer, and the ground electrode layer had a flat square shape having a side of 6 cm, which had the same size as that of the piezoelectric sheet. The signal electrode layer and the ground electrode layer were each connected to an electric wire.

Comparative Example 1

A piezoelectric sensor was obtained in the same manner as that in Example 1 except that electrode layers formed from an aluminum foil having a thickness of 10 μm were integrally layered via a double-sided adhesive tape on respective surfaces of two polyurethane-based thermoplastic elastomer sheets. Note that the electrode layers formed from the aluminum foil did not have elastic properties.

Comparative Example 2

A piezoelectric sensor was obtained in the same manner as that in Example 1 except that electrode layers formed from aluminum were formed by sputtering on respective surfaces of two polyurethane-based thermoplastic elastomer sheets. Note that the electrode layers formed from the aluminum foil did not have elastic properties.

Comparative Example 3

A piezoelectric sensor was obtained in the same manner as that in Example 1 except that a polyethylene terephthalate sheet having a thickness of 50 μm was used instead of the polyurethane-based thermoplastic elastomer sheets. Note that the polyethylene terephthalate sheet did not have elastic properties.

The property of following stretching and contraction and the detectability of stretching and contraction of the obtained piezoelectric sheet were measured by the following procedure. The results are shown in Table 1.

The ratio of stretching and contraction of the whole piezoelectric sensor thus obtained was measured. The results are shown in Table 1. The ratios of stretching and contraction of the piezoelectric sheet, the fixing agent, the signal electrode layer, the ground electrode layer, and the elastic synthetic resin sheets, which constitute the piezoelectric sensor, were measured by the aforementioned procedure. The results are shown in Table 1. In Comparative Example 2, it was impossible to separate the electrode layer formed from aluminum. Therefore, it was impossible to measure the ratios of stretching and contraction of the signal electrode layer and the ground electrode layer.

(Property of Following Stretching and Contraction)

A rubber sheet having elastic properties, a size larger than that of the piezoelectric sensor, and a flat square shape was prepared. The piezoelectric sensor was bonded in close contact with a surface of the rubber sheet via a double-sided adhesive tape having elastic properties. Accordingly, a specimen was produced. The piezoelectric sensor and the rubber sheet were adjusted so that the edge of the piezoelectric sensor was parallel to the edge of the rubber sheet.

A pressing force was applied to the piezoelectric sensor by an exciter under conditions of a load F of 1 N, a dynamic load of ±0.5 N, a frequency of 30 Hz, and a pressing are of 1 cm$^2$. At that time, a generated voltage was measured. As the voltage, a peak-to-peak value was read. In reading the voltage, an oscilloscope (manufactured by TEXIO TECHNOLOGY CORPORATION) connected to an amplifier (manufactured by MSI) was used.

The voltage of the piezoelectric sheet immediately after the piezoelectric sensor was bonded to the rubber sheet was measured as an initial voltage.

The rubber sheet was stretched along an optional edge thereof by a stretching ratio of 1% or 5%, and the state thereof was maintained. In the present invention, the stretching ratio is a value calculated by the following expression.

Stretching ratio (%)=100×size in stretching direction of rubber sheet after stretching/size in stretching direction of rubber sheet before stretching In the stretched state, the voltage of the piezoelectric sheet was measured by the same procedure as described above as a stretching voltage.

In the piezoelectric sensor of Comparative Example 2, the aluminum layer was disconnected during stretching. In the piezoelectric sensors of Comparative Examples 1 and 3, the signal electrode layer and the ground electrode layer were separated from the surface of the piezoelectric sheet during stretching. Therefore, it was impossible to measure a stretching voltage.

(Detectability of Stretching and Contraction)

A specimen was produced by the same procedure as that in measurement of the property of following stretching and contraction. A rubber sheet was stretched along an optional edge thereof by a stretching ratio of 1% or 5% by TENSILON (manufactured by ORIENTEC Co., LTD), and the voltage generated during stretching was measured. As the voltage, a peak-to-peak value of stretching and contraction was measured.

In the piezoelectric sensor of Comparative Example 2, the aluminum layer was disconnected during stretching. In the piezoelectric sensors of Comparative Examples 1 and 3, the signal electrode layer and the ground electrode layer were separated from the surface of the piezoelectric sheet during stretching. Therefore, it was impossible to measure a voltage generated during stretching.

TABLE 1

| | | EXAMPLE | | | | | COMPARATIVE EXAMPLE | | |
|---|---|---|---|---|---|---|---|---|---|
| | | 1 | 2 | 3 | 4 | 5 | 1 | 2 | 3 |
| FOAMED SHEET | AZODICARBONAMIDE (PART BY MASS) | 6 | 2 | 4 | 12 | 12 | 6 | 6 | 6 |
| | FOAMING RATIO (TIMES) | 9 | 3 | 6 | 15 | 15 | 9 | 9 | 9 |
| | THICKNESS (μm) | 100 | 102 | 101 | 105 | 100 | 100 | 100 | 100 |
| | POROSITY (%) | 89 | 67 | 78 | 93 | 89 | 89 | 89 | 89 |
| PIEZOELECTRIC SHEET | PIEZOELECTRIC CONSTANT d33(pc) | 50 | 25 | 40 | 65 | 65 | 50 | 50 | 50 |
| THICKNESS OF POLYURETHANE-BASED THERMOPLASTIC ELASTOMER SHEET (μm) | | 50 | 50 | 50 | 50 | 25 | 50 | 50 | — |
| THICKNESS OF POLYETHYLENE TEREPHTHALATE SHEET (μm) | | — | — | — | — | — | — | — | 50 |
| THICKNESS OF ELECTRODE LAYER (μm) | | 50 | 50 | 50 | 50 | 25 | 10 | 1 | 50 |
| RATIO OF STRETCHING AND CONTRACTION (%) | PIEZOELECTRIC SENSOR | 5 | 1 | 3 | 9 | 15 | 0 | 5 | 0 |
| | POLYURETHANE-BASED THERMOPLASTIC ELASTOMER SHEET | 15 | 15 | 15 | 15 | 25 | 15 | 15 | — |
| | POLYETHYLENE TEREPHTHALATE SHEET | — | — | — | — | — | — | — | 0 |
| | SIGNAL ELECTRODE LAYER | 10 | 10 | 10 | 10 | 20 | 0 | — | 10 |
| | PIEZOELECTRIC SHEET | 8 | 2 | 6 | 17 | 17 | 8 | 8 | 8 |
| | GROUND ELECTRODE LAYER | 10 | 10 | 10 | 10 | 20 | 0 | — | 10 |
| | FIXING AGENT | 50 | 50 | 50 | 50 | 50 | 50 | 50 | 50 |
| PROPERTY OF FOLLOWING STRETCHING AND CONTRACTION DETECTABILITY OF STRETCHING AND CONTRACTION | INITIAL VOLTAGE (mV) | 100 | 50 | 76 | 148 | 148 | 98 | 90 | 102 |
| | STRETCHING VOLTAGE (mV) STRETCHING RATIO 1% | 96 | 49 | 75 | 136 | 137 | — | — | — |
| | STRETCHING VOLTAGE (mV) STRETCHING RATIO 5% | 98 | — | — | 140 | 140 | — | — | — |
| | VOLTAGE (mV) STRETCHING RATIO 1% | 65 | 37 | 55 | 98 | 105 | — | — | — |
| | VOLTAGE (mV) STRETCHING RATIO 5% | 200 | — | — | 306 | 350 | — | — | — |

INDUSTRIAL APPLICABILITY

The piezoelectric sensor of the present invention has elastic properties in a surface direction thereof. Even when a surface of a body to be measured on which the piezoelectric sensor is disposed is stretched or contracted in a surface direction thereof, the piezoelectric sensor of the present invention can smoothly follow stretching and contraction of the body to be measured, maintain excellent adhesion to the body to be measured, and accurately measure the movement of the body to be measured. Further, the piezoelectric sensor of the present invention can also detect the movement in the surface direction of the surface of the body to be measured on which the piezoelectric sensor is disposed.

Therefore, the piezoelectric sensor of the present invention can be suitably used for wearable applications. The piezoelectric sensor of the present invention can be used for applications in which movement of the body to be measured including transportation equipment such as a vehicle, a human body, a concrete structure, and a bridge is measured.

CROSS-REFERENCE TO RELATED APPLICATION

The present application claims the priority under Japanese Patent Application No. 2016-174038 filed on Sep. 6, 2016, the disclosure of which is hereby incorporated in its entirety by reference.

REFERENCE SIGNS LIST

1 piezoelectric sheet
2 signal electrode layer
3 ground electrode layer
4, 5 elastic synthetic resin sheet
6, 7 fixing agent
A piezoelectric sensor

The invention claimed is:

1. A piezoelectric sensor comprising:
a piezoelectric sheet including a porous synthetic resin sheet;
a signal electrode layer that is layered on a surface of the piezoelectric sheet and contains conductive fine particles and a binder resin having elastic properties; and
a ground electrode layer that is layered on another surface of the piezoelectric sheet and contains conductive fine particles and a binder resin having elastic properties,
wherein the porous synthetic resin sheet has a foaming ratio of 2 to 10 times.

2. The piezoelectric sensor according to claim 1, wherein the signal electrode layer and/or the ground electrode layer are/is supported by an elastic synthetic resin sheet.

3. The piezoelectric sensor according to claim 2, wherein the elastic synthetic resin sheet includes any of a thermoplastic elastomer sheet and a rubber sheet.

4. The piezoelectric sensor according to claim 1, wherein the piezoelectric sensor has a ratio of stretching and contraction of 0.5% or more.

5. The piezoelectric sensor according to claim 1, wherein the piezoelectric sheet has a ratio of stretching and contraction of 7% or less.

6. The piezoelectric sensor according to claim 1, wherein the piezoelectric sensor is capable of generating a voltage when stretched at a stretching ratio of 1%.

* * * * *